US012590247B2

(12) United States Patent
Hwang et al.

(10) Patent No.: US 12,590,247 B2
(45) Date of Patent: Mar. 31, 2026

(54) ETCHING COMPOSITION, METHOD OF ETCHING METAL-CONTAINING FILM BY USING THE SAME, AND METHOD OF PREPARING SEMICONDUCTOR DEVICE BY USING THE SAME

(71) Applicant: Samsung Electronics Co., Ltd., Suwon-si (KR)

(72) Inventors: Kyuyoung Hwang, Suwon-si (KR); Byungjoon Kang, Suwon-si (KR); Daihyun Kim, Suwon-si (KR); Sungmin Kim, Suwon-si (KR); Hwang Suk Kim, Suwon-si (KR); Mihyun Park, Suwon-si (KR); Jungmin Oh, Suwon-si (KR); Hyosan Lee, Suwon-si (KR); Byoungki Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 148 days.

(21) Appl. No.: 18/194,908

(22) Filed: Apr. 3, 2023

(65) Prior Publication Data

US 2023/0313040 A1 Oct. 5, 2023

(30) Foreign Application Priority Data

Apr. 4, 2022 (KR) ........................ 10-2022-0041912
Dec. 5, 2022 (KR) ........................ 10-2022-0168159
Mar. 30, 2023 (KR) ........................ 10-2023-0042149

(51) Int. Cl.
*C09K 13/00* (2006.01)
*C23F 1/16* (2006.01)
(Continued)

(52) U.S. Cl.
CPC ................ *C09K 13/00* (2013.01); *C23F 1/16* (2013.01); *H01L 21/31111* (2013.01); *H01L 21/32134* (2013.01)

(58) Field of Classification Search
CPC ............... C09K 13/00; H01L 21/31111; H01L 21/32134; C23F 1/16; C23F 1/20; C23F 1/26
(Continued)

(56) References Cited

U.S. PATENT DOCUMENTS 3,849,263 A 11/1974 Gedde
6,086,779 A * 7/2000 Bishop ...................... C23F 1/46 216/13
(Continued)

FOREIGN PATENT DOCUMENTS

CN 102858093 A * 1/2013 ......... C23C 18/1216
CN 112593221 A 4/2021
(Continued)

OTHER PUBLICATIONS

Extended European Search Report dated Jan. 25, 2024 for corresponding European Patent Application No. 23165828.7.
(Continued)

*Primary Examiner* — Duy Vu N Deo
(74) *Attorney, Agent, or Firm* — HARNESS, DICKEY & PIERCE, P.L.C.

(57) ABSTRACT

Provided are an etching composition including an oxidizing agent, an ammonium salt, an aqueous solvent, and an accelerator, a method of preparing a metal-containing film etching by using the same, and a method of manufacturing a semiconductor device by using the same.

20 Claims, 3 Drawing Sheets

(51) Int. Cl.
*H01L 21/311* (2006.01)
*H01L 21/3213* (2006.01)

(58) Field of Classification Search
USPC ................................ 438/689; 252/79.1–79.5
See application file for complete search history.

(56) References Cited

U.S. PATENT DOCUMENTS

| | | | | |
|---|---|---|---|---|
| 7,888,302 | B2 | 2/2011 | Wu et al. | |
| 2011/0150797 | A1 | 6/2011 | Legrand et al. | |
| 2016/0116836 | A1* | 4/2016 | Kim | G03F 1/82 430/5 |
| 2016/0177457 | A1 | 6/2016 | Yokomizo et al. | |
| 2016/0264426 | A1* | 9/2016 | Kerrigan | C01B 33/107 |
| 2017/0029958 | A1* | 2/2017 | An | C23F 1/18 |
| 2020/0079998 | A1 | 3/2020 | Takahashi et al. | |
| 2021/0104411 | A1* | 4/2021 | Chung | H01L 21/30604 |
| 2021/0238478 | A1 | 8/2021 | Lee et al. | |
| 2023/0313040 | A1 | 10/2023 | Hwang et al. | |

FOREIGN PATENT DOCUMENTS

| | | | | |
|---|---|---|---|---|
| CN | 114438495 | A | 5/2022 | |
| FR | 2925304 | A1 | 6/2009 | |
| FR | 2980637 | A1 * | 3/2013 | H01L 21/30604 |
| JP | S5915375 | B2 | 4/1984 | |
| KR | 10-2003-0079322 | A | 10/2003 | |
| KR | 20030079322 | A * | 10/2003 | |
| KR | 10-2016-0029094 | A | 3/2016 | |
| KR | 10-2020-0048140 | A | 5/2020 | |
| KR | 10-2020-0077839 | A | 7/2020 | |
| KR | 10-2020-0112673 | A | 10/2020 | |
| KR | 10-2020-0114899 | A | 10/2020 | |
| KR | 10-2020-0117615 | A | 10/2020 | |
| KR | 10-2021-0061368 | A | 5/2021 | |
| KR | 10-2021-0095806 | A | 8/2021 | |
| KR | 10-2022-0081549 | A | 6/2022 | |

OTHER PUBLICATIONS

Extended European Search Report dated Jan. 25, 2024 for corresponding European Patent Application No. 23165831.1.

Office Action dated Aug. 27, 2025 issued in U.S. Appl. No. 18/194,875.

Notice of Allowance dated Jan. 9, 2026 issued in U.S. Appl. No. 18/194,875.

* cited by examiner

ETCHING COMPOSITION, METHOD OF ETCHING METAL-CONTAINING FILM BY USING THE SAME, AND METHOD OF PREPARING SEMICONDUCTOR DEVICE BY USING THE SAME

CROSS-REFERENCE TO RELATED APPLICATIONS

This application is based on and claims priority under 35 U.S.C. § 119 to Korean Patent Application Nos. 10-2022-0041912, filed on Apr. 4, 2022, 10-2022-0168159, filed on Dec. 5, 2022, and 10-2023-0042149, filed on Mar. 30, 2023, in the Korean Intellectual Property Office, the disclosures of which are incorporated by reference herein in their entirety.

BACKGROUND

1. Field

The present disclosure relates to an etching composition, a method of etching a metal-containing film by using the same, and a method of manufacturing a semiconductor device by using the same.

2. Description of the Related Art

To satisfy excellent performance and low price demanded by consumers, an increase in the degree of integration and improvement in reliability of semiconductor devices are required. As the degree of integration of the semiconductor devices increases, damage to components of the semiconductor devices during a process of manufacturing the semiconductor devices has a greater effect on reliability and electrical characteristics of semiconductor memory devices. In particular, in the process of manufacturing the semiconductor devices, various etching processes may be performed on a predetermined film (e.g., a metal-containing film). However, to perform an effective etching process, the need for an etching composition capable of providing an excellent etching speed, excellent etching selectivity for adjacent films, the absence of surface residues after etching, excellent storage stability, and the like has been continuously demanded.

SUMMARY

Provided is an etching composition having a high etching speed for a metal-containing film, which is a target film to be etched, and excellent etching selectivity for adjacent films composition, with substantially leaving no surface residue on a surface of a target etching film after the etching.

Additional aspects will be set forth in part in the description which follows and, in part, will be apparent from the description, or may be learned by practice of the presented embodiments of the disclosure.

According to an embodiment, an etching composition may include an oxidizing agent, an ammonium salt, an aqueous solvent, and an accelerator. The ammonium salt may include an ammonium cation and an organic anion. The accelerator may include a compound represented by Formula 1-1, a compound represented by Formula 1-2, a compound represented by Formula 1-3, a compound represented by Formula 1-4, a compound represented by Formula 1-5, a compound represented by Formula 1-6, a compound represented by Formula 1-7, a compound represented by Formula 1-8, or any combination thereof:

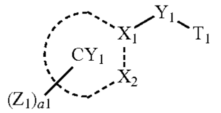

1-1

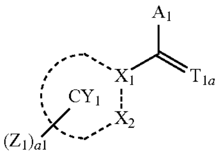

1-2

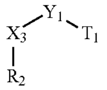

1-3

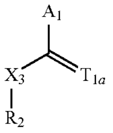

1-4

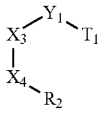

1-5

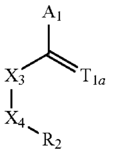

1-6

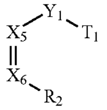

1-7

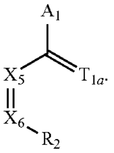

1-8

In Formulae 1-1 to 1-8, $CY_1$ may be a $C_3$-$C_8$ saturated cyclic group, $X_1$ may be C or N, $X_2$ may be $C(R_2)$, $N(R_2)$, O, S or N(H), $X_1$ and $X_2$ may be linked to each other via a single bond, $X_3$ is $C(Z_1)(Z_2)$, $N(Z_1)$, C(═O) or C(═S), $X_4$ is $C(Z_{11})(Z_{12})$, $N(Z_{11})$, C(═O) or C(═S), $X_5$ is $C(Z_1)$ or N, $X_6$ is $C(Z_{11})$ or N, $Y_1$ is $C(Z_3)(Z_4)$, $N(Z_3)$, C(═O) or C(═S), $T_1$ is *—OH, *—SH, or *—$NH_2$, $T_{1a}$ is or S, $R_2$ is *—$O(Z_5)$, *—$S(Z_5)$, or *—$N(Z_5)(Z_6)$, $Z_1$ to $Z_6$, $Z_{11}$, and $Z_{12}$ are each independently, hydrogen, deuterium, *—F, *—Cl, *—Br, *—I, *—OH, *—SH, *—$NH_2$, *—C(═O)H, *—C(═S)H, *—C(═O)—OH, *—C(═S)—OH, *—C(═O)—SH, *—C(═S)—SH, *—C(═O)—($NH_2$), *—C(═S)—($NH_2$), *—NH—C(═O)—($NH_2$), *—NH—C(═S)—

$(NH_2)$, *—C(OH)—C(═O)—OH, *—C(SH)—C(═O)—OH, *—C(OH)—C(═S)—OH, *—C(OH)—C(═O)—SH, *—C(SH)—C(═S)—OH, *—C(SH)—C(═O)—SH, *—C(OH)—C(═S)—SH, *—C(SH)—C(═S)—SH, *—C(═O)—C(═O)—OH, *—C(═S)—C(═O)—OH, *—C(═O)—C(═S)—OH, *—C(═O)—C(═O)—SH, *—C(═S)—C(═S)—OH, *—C(═S)—C(═O)—SH, *—C(═O)—C(═S)—SH, *—C(═S)—C(═S)—SH, or *—C(═O)—$ONH_4$; or a $C_1$-$C_{20}$ alkyl group, a $C_2$-$C_{20}$ alkenyl group, a $C_1$-$C_{20}$ alkoxy group, a $C_6$-$C_{20}$ aryl group, or a $C_2$-$C_{20}$ heteroaryl group, unsubstituted or substituted with deuterium, *—F, *—Cl, *—Br, *—OH, *—SH, *—$NH_2$, *—C(═O)H, *—C(═S)H, *—C(═O)—OH, *—C(═S)—OH, *—C(═O)—SH, *—C(═S)—SH, *—C(═O)—$(NH_2)$, *—C(═S)—$(NH_2)$, *—NH—C(═O)—$(NH_2)$, *—NH—C(═S)—$(NH_2)$, *—C(OH)—C(═O)—OH, *—C(SH)—C(═O)—OH, *—C(OH)—C(═S)—OH, *—C(OH)—C(═O)—SH, *—C(SH)—C(═S)—OH, *—C(SH)—C(═O)—SH, *—C(OH)—C(═S)—SH, *—C(SH)—C(═S)—SH, *—C(═O)—C(═O)—OH, *—C(═S)—C(═O)—OH, *—C(═O)—C(═S)—OH, *—C(═O)—C(═O)—SH, *—C(═S)—C(═S)—OH, *—C(═S)—C(═O)—SH, *—C(═O)—C(═S)—SH, *—C(═S)—C(═S)—SH, *—C(═O)—$ONH_4$, or any combination thereof, a1 is an integer from 0 to 5, $A_1$ is, hydrogen or deuterium; or a $C_1$-$C_{20}$ alkyl group, a $C_2$-$C_{20}$ alkenyl group, a $C_1$-$C_{20}$ alkoxy group, a $C_6$-$C_{20}$ aryl group, or a $C_2$-$C_{20}$ heteroaryl group, unsubstituted or substituted with deuterium, *—F, *—Cl, *—Br, *—I, a $C_1$-$C_{20}$ alkyl group, a $C_1$-$C_{20}$ alkoxy group, or any combination thereof, and

* indicates a binding site to a neighboring atom.

In some embodiments, $CY_1$ may be a 5-membered saturated cyclic group or a 6-membered saturated cyclic group.

In some embodiments, in Formulae 1-1 and 1-2, $CY_1$ may be a cyclopentane group, a cyclohexane group, a cycloheptane group, a pyrrolidine group, a piperidine group, an azepane group, a tetrahydrofuran group, a tetrahydrothiophene group, a tetrahydro-2H-pyran group, or a tetrahydro-2H-thiopyran group.

In some embodiments, in Formulae 1-3 to 1-8, $X_3$ is $C(Z_1)(Z_2)$, C(═O) or C(═S), $X_4$ is $C(Z_{11})(Z_{12})$, C(═O) or C(═S), $X_5$ is $C(Z_1)$, $X_6$ is $C(Z_{11})$, $Y_1$ is $C(Z_3)(Z_4)$, C(═O) or C(═S), $T_1$ is *—OH or *—SH, $R_2$ is *—$O(Z_5)$ or *—$S(Z_5)$, and $Z_1$ to $Z_6$, $Z_{11}$, and $Z_{12}$ are each independently, hydrogen, deuterium, *—F, *—Cl, *—Br, *—I, *—OH, *—SH, *—C(═O)H, *—C(═S)H, *—C(═O)—OH, *—C(═S)—OH, *—C(═O)—SH, *—C(═S)—SH, *—C(OH)—C(═O)—OH, *—C(SH)—C(═O)—OH, *—C(OH)—C(═S)—OH, *—C(OH)—C(═O)—SH, *—C(SH)—C(═S)—OH, *—C(SH)—C(═O)—SH, *—C(OH)—C(═S)—SH, *—C(SH)—C(═S)—SH, *—C(═O)—C(═O)—OH, *—C(═S)—C(═O)—OH, *—C(═O)—C(═S)—OH, *—C(═O)—C(═O)—SH, *—C(═S)—C(═S)—OH, *—C(═S)—C(═O)—SH, *—C(═O)—C(═S)—SH, or *—C(═S)—C(═S)—SH; or a $C_1$-$C_{20}$ alkyl group, a $C_2$-$C_{20}$ alkenyl group, a $C_1$-$C_{20}$ alkoxy group, a $C_6$-$C_{20}$ aryl group, or a $C_2$-$C_{20}$ heteroaryl group, unsubstituted or substituted with deuterium, *—F, *—Cl, *—Br, *—I, *—OH, *—SH, *—C(═O)H, *—C(═S)H, *—C(═O)—OH, *—C(═S)—OH, *—C(═O)—SH, *—C(═S)—SH, *—C(OH)—C(═O)—OH, *—C(SH)—C(═O)—OH, *—C(OH)—C(═S)—OH, *—C(OH)—C(═O)—SH, *—C(SH)—C(═S)—OH, *—C(SH)—C(═O)—SH, *—C(OH)—C(═S)—SH, *—C(SH)—C(═S)—SH, *—C(═O)—C(═O)—OH, *—C(═S)—C(═O)—OH, *—C(═O)—C(═S)—OH, *—C(═O)—C(═O)—SH, *—C(═S)—C(═S)—OH, *—C(═S)—C(═O)—SH, *—C(═O)—C(═S)—SH, *—C(═S)—C(═S)—SH, or any combination thereof.

In some embodiments, the accelerator may include a compound represented by Formula 1-1, a compound represented by Formula 1-2, or any combination thereof.

In some embodiments, the accelerator may include a compound represented by Formula 1-3, a compound represented by Formula 1-4, a compound represented by Formula 1-5, a compound represented by Formula 1-6, a compound represented by Formula 1-7, a compound represented by Formula 1-8, or any combination thereof.

In some embodiments, an amount of the oxidizing agent may be in a range of 1 wt % to 50 wt % based on 100 wt % of the etching composition.

In some embodiments, an amount of the ammonium salt may be in a range of 0.5 wt % to 20 wt % based on 100 wt % of the etching composition.

In some embodiments, an amount of the accelerator may be in a range of 0.001 wt % to 20 wt % based on 100 wt % of the etching composition.

In some embodiments, the etching composition may have a pH in a range of 3.0 to 8.3.

According to an embodiment, a method of etching a metal-containing film may include preparing a substrate provided with a metal-containing film, and removing at least a portion of the metal-containing film by performing an etching process using the etching composition on the metal-containing film.

In some embodiments, the metal-containing film may include indium (In), titanium (Ti), aluminum (Al), lanthanum (La), scandium (Sc), gallium (Ga), zinc (Zn), hafnium (Hf), or any combination thereof.

In some embodiments, the metal-containing film may include a metal nitride, a metal oxide, a metal oxynitride, or a combination thereof.

In some embodiments, the metal-containing film may comprise a first region and a second region, a second etching speed that the etching composition etches the second region may be greater than a first etching speed that the etching composition etches the first region, and the etching process may be performed by contacting the etching composition with at least a portion of the first region and at least a portion of the second region.

In some embodiments, the first region substantially may have an etching resistance to the etching composition, and at least a portion of the second region in the metal-containing film may be removed by the etching process.

In some embodiments, the second region may comprise i) a titanium nitride, ii) a titanium nitride that further includes In, Al, La, Sc, Ga, Zn, Hf, or any combination thereof, or iii) a combination thereof.

According to an embodiment, a method of manufacturing a semiconductor device may include preparing a substrate provided with a metal-containing film, and removing at least a portion of the metal-containing film by performing an etching process using the etching composition on the metal-containing film.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
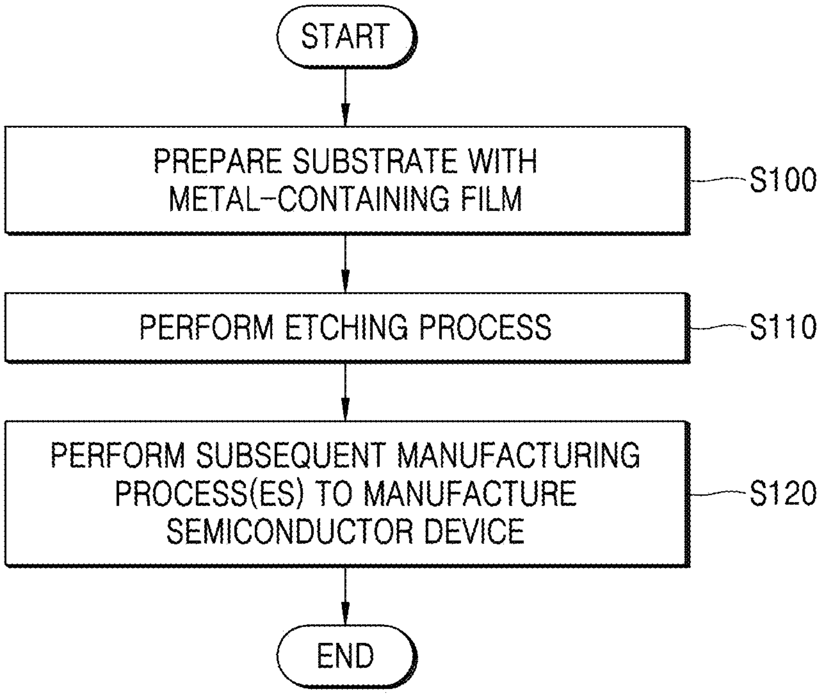
FIG. 1 is a flow chart illustrating operations of a method of manufacturing a semiconductor device according to example embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figure, to explain aspects. As used herein, the term "and/or" includes any and all combinations of one or more of the associated listed items. Expressions such as "at least one of," when preceding a list of elements, modify the entire list of elements and do not modify the individual elements of the list.

For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

Target Etching Film

A target etching film may include a metal-containing film.

Accordingly, an etching composition may be used for etching process and/or CMP (Chemical Mechanical Polishing) process for a metal-containing film.

A metal included in the metal-containing film may include an alkali metal (e.g., sodium (Na), potassium (K), rubidium (Rb), cesium (Cs), etc.), an alkaline earth metal (e.g., beryllium (Be), magnesium (Mg), calcium (Ca), strontium (Sr), barium (Ba), etc.), a lanthanide metal (e.g., lanthanum (La), europium (Eu), terbium (Tb), ytterbium (Yb), etc.), a transition metal (e.g., scandium (Sc), yttrium (Y), titanium (Ti), zirconium (Zr), hafnium (Hf), vanadium (V), niobium (Nb), tantalum (Ta), chromium (Cr), molybdenum (Mo), tungsten (W), manganese (Mn), iron (Fe), ruthenium (Ru), osmium (Os), cobalt (Co), rhodium (Rh), nickel (Ni), copper (Cu), silver (Ag), zinc (Zn), etc.), a post-transition metal (e.g., aluminum (Al), gallium (Ga), indium (In), thallium (Tl), tin (Sn), bismuth (Bi), etc.), or any combination thereof.

In an embodiment, the metal-containing film may include In, Ti, Al, Cu, W, Co, La, Sc, Ga, Zn, Hf, or any combination thereof.

In one or more embodiments, the metal-containing film may include In, Ti, Al, La, Sc, Ga, Zn, Hf, or any combination thereof.

In one or more embodiments, the metal-containing film may include Al, Ti, La, or any combination thereof.

In one or more embodiments, the metal-containing film may include Al.

In one or more embodiments, the metal-containing film may include Ti.

In one or more embodiments, the metal-containing film may include Ti and Al.

The metal-containing film may include a metal nitride, a metal oxide, a metal oxynitride, or a combination thereof.

The metal-containing film may include a metal nitride, a metal oxide, a metal oxynitride, or a combination thereof and a metal included in each of the metal nitride, the metal oxide and the metal oxynitride may include In, Ti, Al, La, Sc, Ga, Zn, Hf, or any combination thereof.

The metal-containing film may include a metal nitride. A metal included in the metal nitride may include In, Ti, Al, La, Sc, Ga, Zn, Hf, or any combination thereof.

For example, the metal-containing film may include a titanium nitride. The titanium nitride may further include In, Al, La, Sc, Ga, Hf, Zn, or any combination thereof. For example, the metal-containing film may include a titanium nitride (TiN), a titanium nitride that further includes Al (e.g., a titanium/aluminum nitride or TiAlN), a titanium nitride that further includes La, and the like.

In one or more embodiments, the metal-containing film may include a metal oxide. A metal included in the metal oxide may include Ti, Al, La, Sc, Ga, Hf, or any combination thereof. For example, the metal-containing film may include an aluminum oxide (e.g., $Al_2O_3$), an indium gallium zinc oxide (IGZO), and the like.

In one or more embodiments, the metal-containing film may include the metal nitride and the metal oxide.

In one or more embodiments, the metal-containing film may further include, in addition to the aforementioned metal, a metalloid (e.g., boron (B), silicon (Si), germanium (Ge), arsenic (As), antimony (Sb), tellurium (Te), etc.), a non-metal (e.g., nitrogen (N), phosphorus (P), oxygen (O), sulfur (S), selenium (Se), etc.), or any combination thereof.

For example, the metal-containing film may further include a silicon oxide.

The metal-containing film may have a single-layer structure consisting of (or including) one or more types of materials or a multi-layer structure including different materials from each other. For example, the metal-containing film may have i) a single-layer structure consisting of (or including) the titanium nitride, ii) a double-layer structure including a first layer consisting (or including) the titanium nitride and a second layer consisting of (or including) the titanium nitride that further includes Al, or iii) a double-layer structure including the first layer consisting of (or including) the titanium nitride and a second layer consisting of (or including) the aluminum oxide.

In one or more embodiments, the metal-containing film may comprise a first region and a second region, and a second etching speed that the etching composition etches the second region may be greater than a first etching speed that the etching composition etches the first region. During the etching process and/or the CMP process, at least a portion of the first region and at least a portion of the second region may be in contact with the etching composition and the second region may be etched faster than the first region since the second etching speed may be greater than the first etching speed.

For example, the first region may include at least one of the metal oxide (e.g., the aluminum oxide) and the silicon oxide.

For example, the second region may include the metal nitride.

For example, the second region may include i) the titanium nitride, ii) the titanium nitride that further includes In, Al, La, Sc, Ga, Zn, Hf, or any combination thereof, or iii) a combination thereof.

Etching any film described herein may refer to removing least some of materials constituting a film.

Etching Composition

An etching composition may include an oxidizing agent, an ammonium salt, an accelerator, and an aqueous solvent.

The etching composition may be used for etching process and/or CMP process to the target etching film described herein, such as the metal-containing film.

In an embodiment, the etching composition may not include at least one of a fluorine (F)-containing compound, a metal-containing compound, an inorganic anion-containing salt, and an inorganic acid (e.g., a fluorine (F)-containing compound, a metal-containing compound, an inorganic anion-containing salt, and an inorganic acid).

The F-containing compound refers to any compound that is dissociable in an aqueous solvent while containing F, and an example thereof includes HF or the like.

The metal-containing compound refers to any compound that is dissociable in an aqueous solvent while containing a metal. For example, the metal may be an alkali metal (e.g., lithium (Li), Na, potassium (K), Rb, Cs, etc.), an alkaline earth metal (e.g., Be, Mg, Ca, Sr, Ba, etc.), Zn, or the like. Examples of the metal-containing compound include 5-methyltetrazol sodium, 5-methyltetrazol lithium, and the like.

Examples of the inorganic anion-containing salt include ammonium fluoride ($NH_4F$), ammonium chloride ($NH_4Cl$), and the like.

The inorganic acid is an acid produced by a chemical reaction of an inorganic compound, and examples thereof include hydrochloric acid, nitric acid, sulfuric acid, phosphoric acid, and the like.

In an embodiment, the etching composition may consist of the oxidizing agent, the ammonium salt, the aqueous solvent, and the accelerator.

In one or more embodiments, the etching composition may consist of hydrogen peroxide, the ammonium salt, water, and the accelerator.

Oxidizing Agent

The oxidizing agent serves to etch the metal-containing film, and may include, for example, hydrogen peroxide.

An amount (weight) of the oxidizing agent may be, for example, in a range of 1 wt % to 50 wt %, 5 wt % to 30 wt %, 10 wt % to 25 wt %, or 15 wt % to 25 wt %, based on 100 wt % of the etching composition.

Ammonium Salt

The ammonium salt may serve to etch the metal-containing film, and may include an ammonium cation ($NH_4^+$ ion) and an organic anion.

The organic anion may include, for example, at least one of $[(R_{10})CO_2]^-$, $[CO_3]^{2-}$, $[NO_3]^-$, $[(R_{10})SO_4]^-$, $[(R_{10})SO_3]^-$, citrate ($[C_6H_7O_7]^-$, $[C_6H_6O_7]^{2-}$ or $[C_6H_5O_7]^{3-}$), phosphate ($[PO_3]^{3-}$), sulfite ($[SO_3]^{2-}$), oxalate ($[C_2O_4]^{2-}$), tartrate ($[C_4H_4O_6]^{2-}$), glutamate ($[C_5H_8NO_4]^-$), salicylate ($[C_7H_5O_3]^-$) and tetrafluoroborate ($[BF_4]^-$).

$R_{10}$ may be, hydrogen, deuterium, *—OH, *—SH, or *—$NH_2$; or a $C_1$-$C_{20}$ alkyl group, a $C_2$-$C_{20}$ alkenyl group, a $C_1$-$C_{20}$ alkoxy group, a $C_6$-$C_{20}$ aryl group (e.g., a phenyl group), or a $C_2$-$C_{20}$ heteroaryl group, unsubstituted or substituted with deuterium, *—F, *—Cl, *—Br, *—I, *—OH, *—SH, *—$NH_2$, *—C(=O)—OH, a $C_1$-$C_{20}$ alkyl group, a $C_1$-$C_{20}$ alkoxy group, or any combination thereof.

In an embodiment, the organic anion may include at least one of acetate, bicarbonate, benzoate, carbonate, formate, nitrate, hydrogen sulfate, carbamate, trifluoroacetate, sulfamate, citrate, phosphate, sulfite, sulfobenzoate, oxalate, lactate, tartrate, dihydrogencitrate, glutamate, salicylate, bioxalate, octanoate, propionate, glycolate, tetrafluoroborate, and gluconate.

In an embodiment, the organic anion may include at least two carbons.

In an embodiment, the ammonium salt may include at least one of ammonium acetate, ammonium bicarbonate, ammonium benzoate, ammonium carbonate, ammonium formate, ammonium nitrate, ammonium hydrogen sulfate, ammonium carbamate, ammonium trifluoroacetate, ammonium sulfamate, ammonium citrate dibasic, ammonium citrate tribasic, ammonium phosphate tribasic, ammonium sulfite, 2-sulfobenzoic acid ammonium salt, ammonium oxalate monohydrate, ammonium lactate, ammonium tartrate, ammonium dihydrogencitrate, L-glutamic acid monoammonium salt, ammonium salicylate, ammonium bioxalate monohydrate, ammonium octanoate, ammonium propionate, ammonium glycolate, ammonium tetrafluoroborate and ammonium gluconate.

The ammonium salt may not include an inorganic anion, such as a halogen anion (an $F^-$ anion, a $C^-$ anion, etc.), and the like. Thus, the ammonium salt is clearly distinguished from an ammonium salt containing only an inorganic anion, such as ammonium chloride ($NH_4Cl$), and the like.

The ammonium salt may not include a phosphate. For example, the ammonium salt is not a monobasic ammonium phosphate ($(NH^{4+})H_2PO_4^-$).

The ammonium salt may not include a sulfate and a carbonate. For example, the ammonium salt is not an ammonium sulfate and an ammonium carbonate.

The amount (weight) of the ammonium salt may be, based on 100 wt % of the etching composition, in a range of 0.5 wt % to 20 wt %, 0.5 wt % to 10 wt %, 1 wt % to 20 wt %, 1 wt % to 10 wt %, 1 wt % to 7 wt %, or 1 wt % to 5 wt %.

Aqueous Solvent

The aqueous solvent is clearly distinguished from various organic solvents, and may include, for example, water (e.g., deionized water).

In an embodiment, the aqueous solvent may be water.

In one or more embodiments, the etching composition may not include an organic solvent.

Accelerator

The accelerator may include (or consists of) a compound represented by Formula 1-1, a compound represented by Formula 1-2, a compound represented by Formula 1-3, a compound represented by Formula 1-4, a compound represented by Formula 1-5, a compound represented by Formula 1-6, a compound represented by Formula 1-7, a compound represented by Formula 1-8, or any combination thereof:

1-1

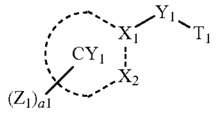

1-2

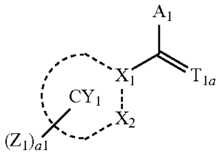

1-3

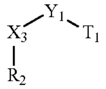

1-4

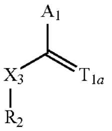

1-5

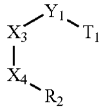

1-6

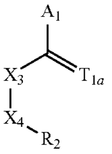

1-7

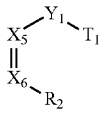

1-8

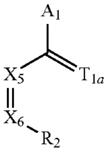

In Formulae 1-1 to 1-8, $CY_1$ may be a $C_3$-$C_8$ saturated cyclic group.

In an embodiment, $CY_1$ may be a $C_4$-$C_6$ saturated cyclic group.

In one or more embodiments, $CY_1$ may be a 5-membered saturated cyclic group, a 6-membered saturated cyclic group, or a 7-membered saturated cyclic group.

In one or more embodiments, $CY_1$ may be a cyclopentane group, a cyclohexane group, a cycloheptane group, a pyrrolidine group, a piperidine group, an azepane group, a tetrahydrofuran group, a tetrahydrothiophene group, a tetrahydro-2H-pyran group, or a tetrahydro-2H-thiopyran group.

In Formulae 1-1 and 1-2, $X_1$ may be C or N, $X_2$ may be $C(R_2)$, $N(R_2)$, O, S or N(H), and $X_1$ and $X_2$ may be linked to each other via a single bond. $R_2$ is the same as described herein.

In Formulae 1-1 to 1-6, $X_3$ may be $C(Z_1)(Z_2)$, $N(Z_1)$, C(═O) or C(═S), and $X_4$ may be $C(Z_{11})(Z_{12})$, $N(Z_{11})$, C(═O) or C(═S), in Formulae 1-7 and 1-8, $X_5$ may be $C(Z_1)$ or N, and $X_6$ may be $C(Z_{11})$ or N, in Formulae 1-1, 1-3, 1-5 and 1-7, $Y_1$ may be $C(Z_3)(Z_4)$, $N(Z_3)$, C(═O) or C(═S). Each of $Z_1$ to $Z_4$, $Z_{11}$ and $Z_{12}$ is the same as described herein.

In Formulae 1-1 to 1-8, $T_1$ may be *—OH, *—SH, or *—$NH_2$, $T_{1a}$ may be O or S, $R_2$ may be *—$O(Z_5)$, *—$S(Z_5)$, or *—$N(Z_5)(Z_6)$. Each of $Z_5$ and $Z_6$ is the same as described herein.

In an embodiment, $T_1$ and $R_2$ may be identical to each other.

In one or more embodiments, $T_1$ and $R_2$ may be different from each other.

$Z_1$ to $Z_6$, $Z_{11}$, and $Z_{12}$ may be each independently, hydrogen, deuterium, *—F, *—Cl, *—Br, *—I, *—OH, *—SH, *—$NH_2$, *—C(═O)H, *—C(═S)H, *—C(═O)—OH, *—C(═S)—OH, *—C(═O)—SH, *—C(═S)—SH, *—C(═O)—($NH_2$), *—C(═S)—($NH_2$), *—NH—C(═O)—($NH_2$), *—NH—C(═S)—($NH_2$), *—C(OH)—C(═O)—OH, *—C(SH)—C(═O)—OH, *—C(OH)—C(═S)—OH, *—C(OH)—C(═O)—SH, *—C(SH)—C(═S)—OH, *—C(SH)—C(═O)—SH, *—C(OH)—C(═S)—SH, *—C(SH)—C(═S)—SH, *—C(═O)—C(═O)—OH, *—C(═S)—C(═O)—OH, *—C(═O)—C(═S)—OH, *—C(═O)—C(═O)—SH, *—C(═S)—C(═S)—OH, *—C(═S)—C(═O)—SH, *—C(═O)—C(═S)—SH, *—C(═S)—C(═S)—SH, or *—C(═O)—$ONH_4$; or a $C_1$-$C_{20}$ alkyl group (e.g., a $C_1$-$C_{10}$ alkyl group), a $C_2$-$C_{20}$ alkenyl group (e.g., a $C_2$-$C_{10}$ alkenyl group), a $C_1$-$C_{20}$ alkoxy group (e.g., a $C_1$-$C_{10}$ alkoxy group), a $C_6$-$C_{20}$ aryl group (e.g., a phenyl group), or a $C_2$-$C_{20}$ heteroaryl group (e.g., a pyridinyl group), unsubstituted or substituted with deuterium, *—F, *—Cl, *—Br, *—I, *—OH, *—SH, *—$NH_2$, *—C(═O)H, *—C(═S)H, *—C(═O)—OH, *—C(═S)—OH, *—C(═O)—SH, *—C(═S)—SH, *—C(═O)—($NH_2$), *—C(═S)—($NH_2$), *—NH—C(═O)—($NH_2$), *—NH—C(═S)—($NH_2$), *—C(OH)—C(═O)—OH, *—C(SH)—C(═O)—OH, *—C(OH)—C(═S)—OH, *—C(OH)—C(═O)—SH, *—C(SH)—C(═S)—OH, *—C(SH)—C(═O)—SH, *—C(OH)—C(═S)—SH, *—C(SH)—C(═S)—SH, *—C(═O)—C(═O)—OH, *—C(═S)—C(═O)—OH, *—C(═O)—C(═S)—OH, *—C(═O)—C(═O)—SH, *—C(═S)—C(═S)—OH, *—C(═S)—C(═O)—SH, *C(O)C(S)SH *C(S)C(S)—SH, *—C(═O)—$ONH_4$, or any combination thereof.

$Z_1$ in Formulae 1-1 and 1-2 may be bonded (or substituted) to any atom forming a backbone of $CY_1$, including $X_1$ and $X_2$.

For example, $Z_1$ to $Z_6$, $Z_{11}$, and $Z_{12}$ may be each independently, hydrogen, deuterium, *—F, *—Cl, *—Br, *—I, *—OH, *—SH, *—$NH_2$, *—C(═O)H, *—C(═S)H, *—C(═O)—OH, *—C(═S)—OH, *—C(═O)—SH, *—C(═S)—SH, *—C(═O)—($NH_2$), *—C(═S)—($NH_2$), *—NH—C(═O)—($NH_2$), *—NH—C(═S)—($NH_2$), *—C(OH)—C(═O)—OH, *—C(SH)—C(═O)—OH, *—C(OH)—C(═S)—OH, *—C(OH)—C(═O)—SH, *—C(SH)—C(═S)—OH, *—C(SH)—C(═O)—SH, *—C(OH)—C(═S)—SH, *—C(SH)—C(═S)—SH, *—C(═O)—C(═O)—OH, *—C(═S)—C(═O)—OH, *—C(═O)—C(═S)—OH,

*—C(═O)—C(═O)—SH, *—C(═S)—C(═S)—OH, *—C(═S)—C(═O)—SH, *—C(═O)—C(═S)—SH, *—C(═S)—C(═S)—SH, or *—C(═O)—$ONH_4$; or a $C_1$-$C_{20}$ alkyl group unsubstituted or substituted with deuterium, *—F, *—Cl, *—Br, *—I, *—OH, *—SH, *—$NH_2$, *—C(═O)H, *—C(═S)H, *—C(═O)—OH, *—C(═S)—OH, *—C(═O)—SH, *—C(═S)—SH, *—C(═O)—($NH_2$), *—C(═S)—($NH_2$), *—NH—C(═O)—($NH_2$), *—NH—C(═S)—($NH_2$), *—C(OH)—C(═O)—OH, *—C(SH)—C(═O)—OH, *—C(OH)—C(═S)—OH, *—C(OH)—C(═O)—SH, *—C(SH)—C(═S)—OH, *—C(SH)—C(═O)—SH, *—C(OH)—C(═S)—SH, *—C(SH)—C(═S)—SH, *—C(═O)—C(═O)—OH, *—C(═S)—C(═O)—OH, *—C(═O)—C(═S)—OH, *—C(═O)—C(═O)—SH, *—C(═S)—C(═S)—OH, *—C(═S)—C(═O)—SH, *—C(═O)—C(═S)—SH, *—C(═S)—C(═S)—SH, *—C(═O)—$ONH_4$, or any combination thereof.

In Formulae 1-1 and 1-2, a1 indicates the number of $Z_1$(s), and may be an integer from 0 to 5. When a1 is 2 or more, two or more of $Z_1$ may be identical to or different from each other.

$A_1$ in Formulae 1-2, 1-4, 1-6 and 1-8 may be, hydrogen or deuterium; or a $C_1$-$C_{20}$ alkyl group (e.g., a $C_1$-$C_{10}$ alkyl group), a $C_2$-$C_{20}$ alkenyl group (e.g., a $C_2$-$C_{10}$ alkenyl group), a $C_1$-$C_{20}$ alkoxy group (e.g., a $C_1$-$C_{10}$ alkoxy group), a $C_6$-$C_{20}$ aryl group (e.g., a phenyl group), or a $C_2$-$C_{20}$ heteroaryl group (e.g., a pyridinyl group), unsubstituted or substituted with deuterium, *—F, *—Cl, *—Br, *—I, a $C_1$-$C_{20}$ alkyl group, a $C_1$-$C_{20}$ alkoxy group, or any combination thereof.

* as used herein indicates a binding site to a neighboring atom.

In an embodiment, In some embodiments, in Formulae 1-3 to 1-8, $X_3$ may be $C(Z_1)(Z_2)$, C(═O) or C(═S), $X_4$ may be $C(Z_{11})(Z_{12})$, C(═O) or C(═S), $X_5$ may be $C(Z_1)$, $X_6$ may be $C(Z_{11})$, $Y_1$ may be $C(Z_3)(Z_4)$, C(═O) or C(═S), $T_1$ may be *—OH or *—SH, $R_2$ may be *—$O(Z_5)$ or *—$S(Z_5)$, and $Z_1$ to $Z_6$, $Z_{11}$, and $Z_{12}$ may be each independently, hydrogen, deuterium, *—F, *—Cl, *—Br, *—OH, *—SH, *—C(═O)H, *—C(═S)H, *—C(═O)—OH, *—C(═S)—OH, *—C(═O)—SH, *—C(═S)—SH, *—C(OH)—C(═O)—OH, *—C(SH)—C(═O)—OH, *—C(OH)—C(═S)—OH, *—C(OH)—C(═O)—SH, *—C(SH)—C(═S)—OH, *—C(SH)—C(═O)—SH, *—C(OH)—C(═S)—SH, *—C(SH)—C(═S)—SH, *—C(═O)—C(═O)—OH, *—C(═S)—C(═O)—OH, *—C(═O)—C(═S)—OH, *—C(═O)—C(═O)—SH, *—C(═S)—C(═S)—OH, *—C(═S)—C(═O)—SH, *—C(═O)—C(═S)—SH, or *—C(═S)—C(═S)—SH; or a $C_1$-$C_{20}$ alkyl group, a $C_2$-$C_{20}$ alkenyl group, a $C_1$-$C_{20}$ alkoxy group, a $C_6$-$C_{20}$ aryl group, or a $C_2$-$C_{20}$ heteroaryl group, unsubstituted or substituted with deuterium, *—F, *—Cl, *—Br, *—OH, *—SH, *—C(═O)H, *—C(═S)H, *—C(═O)—OH, *—C(═S)—OH, *—C(═O)—SH, *—C(═S)—SH, *—C(OH)—C(═O)—OH, *—C(SH)—C(═O)—OH, *—C(OH)—C(═S)—OH, *—C(OH)—C(═O)—SH, *—C(SH)—C(═S)—OH, *—C(SH)—C(═O)—SH, *—C(OH)—C(═S)—SH, *—C(SH)—C(═S)—SH, *—C(═O)—C(═O)—OH, *—C(═S)—C(═O)—OH, *—C(═O)—C(═S)—OH, *—C(═O)—C(═O)—SH, *—C(═S)—C(═S)—OH, *—C(═S)—C(═O)—SH, *—C(═O)—C(═S)—SH, *—C(═S)—C(═S)—SH, or any combination thereof.

In some embodiments, the accelerator may include a compound represented by Formula 1-1, a compound represented by Formula 1-2, or any combination thereof.

In some embodiments, the accelerator may include a compound represented by Formula 1-3, a compound represented by Formula 1-4, a compound represented by Formula 1-5, a compound represented by Formula 1-6, a compound represented by Formula 1-7, a compound represented by Formula 1-8, or any combination thereof.

In an embodiment, the accelerator may include at least one of a compound represented by Formula 1-3 and a compound represented by Formula 1-4, $X_3$ in Formulae 1-3 and 1-4 may be $C(Z_1)(Z_2)$, and least one of $Z_1$ and $Z_2$ may be a $C_1$-$C_{20}$ alkyl group unsubstituted or substituted with deuterium, *—F, *—Cl, *—Br, *—I, *—OH, *—SH, *—$NH_2$, *—C(═O)H, *—C(═S)H, *—C(═O)—OH, *—C(═S)—OH, *—C(═O)—SH, *—C(═S)—SH, *—C(═O)—($NH_2$), *—C(═S)—($NH_2$), *—NH—C(═O)—($NH_2$), *—NH—C(═S)—($NH_2$), *—C(OH)—C(═O)—OH, *—C(SH)—C(═O)—OH, *—C(OH)—C(═S)—OH, *—C(OH)—C(═O)—SH, *—C(SH)—C(═S)—OH, *—C(SH)—C(═O)—SH, *—C(OH)—C(═S)—SH, *—C(SH)—C(═S)—SH, *—C(═O)—C(═O)—OH, *—C(═S)—C(═O)—OH, *—C(═O)—C(═S)—OH, *—C(═O)—C(═O)—SH, *—C(═S)—C(═S)—OH, *—C(═S)—C(═O)—SH, *—C(═O)—C(═S)—SH, *—C(═S)—C(═S)—SH, *—C(═O)—$ONH_4$, or any combination thereof.

In one or more embodiments, the accelerator may include at least one of a compound represented by Formula 1-5 and a compound represented by Formula 1-6, $X_3$ in Formulae 1-5 and 1-6 may be $C(Z_1)(Z_2)$, $X_4$ in Formulae 1-5 and 1-6 may be $C(Z_{11})(Z_{12})$, and least one of $Z_1$, $Z_2$, $Z_{11}$ and $Z_{12}$ may be a $C_1$-$C_{20}$ alkyl group unsubstituted or substituted with deuterium, *—F, *—Cl, *—Br, *—I, *—OH, *—SH, *—$NH_2$, *—C(═O)H, *—C(═S)H, *—C(═O)—OH, *—C(═S)—OH, *—C(═O)—SH, *—C(═S)—SH, *—C(═O)—($NH_2$), *—C(═S)—($NH_2$), *—NH—C(═O)—($NH_2$), *—NH—C(═S)—($NH_2$), *—C(OH)—C(═O)—OH, *—C(SH)—C(═O)—OH, *—C(OH)—C(═S)—OH, *—C(OH)—C(═O)—SH, *—C(SH)—C(═S)—OH, *—C(SH)—C(═O)—SH, *—C(OH)—C(═S)—SH, *—C(SH)—C(═S)—SH, *—C(═O)—C(═O)—OH, *—C(═S)—C(═O)—OH, *—C(═O)—C(═S)—OH, *—C(═O)—C(═O)—SH, *—C(═S)—C(═S)—OH, *—C(═S)—C(═O)—SH, *(O)C(S)—SH *C(S)C(S)—SH, *—C(═O)—$ONH_4$, or any combination thereof.

In one or more embodiments, the accelerator may include two or more different types of compounds.

In one or more embodiments, the accelerator may include two different types of compounds. The weight ratio of the two different types of compounds may be, for example, in a range of 1:9 to 9:1, 2:8 to 8:2, or 3:7 to 7:3.

The amount (weight) of the accelerator may be, based on 100 wt % of the etching composition, in a range of 0.001 wt % to 20 wt %, 0.001 wt % to 15 wt %, 0.001 wt % to 10 wt %, 0.001 wt % to 7 wt %, 0.001 wt % to 5 wt %, 0.001 wt % to 4 wt %, 0.001 wt % to 3 wt %, 0.001 wt % to 2 wt %, 0.001 wt % to 1 wt %, 0.001 wt % to 0.5 wt %, 0.001 wt % to 0.1 wt %, 0.005 wt % to 20 wt %, 0.005 wt % to 15 wt %, 0.005 wt % to 10 wt %, 0.005 wt % to 7 wt %, 0.005 wt % to 5 wt %, 0.005 wt % to 4 wt %, 0.005 wt % to 3 wt %, 0.005 wt % to 2 wt %, 0.005 wt % to 1 wt %, 0.005 wt % to 0.5 wt %, 0.005 wt % to 0.1 wt %, 0.01 wt % to 20 wt %, 0.01 wt % to 15 wt %, 0.01 wt % to 10 wt %, 0.01 wt % to 7 wt %, 0.01 wt % to 5 wt %, 0.01 wt % to 4 wt %, 0.01 wt % to 3 wt %, 0.01 wt % to 2 wt %, 0.01 wt % to 1 wt %, 0.01 wt % to 0.5 wt %, 0.01 wt % to 0.1 wt %, 0.05 wt % to 20 wt %, 0.05 wt % to 15 wt %, 0.05 wt % to 10 wt %, 0.05 wt % to 7 wt %, 0.05 wt % to 5 wt %, 0.05 wt % to 4 wt %, 0.05 wt % to 3 wt %, 0.05 wt % to 2 wt %, 0.05 wt % to 1 wt %, 0.05 wt % to 0.5 wt %, or 0.05 wt % to 0.1 wt %. When the amount of the accelerator is satisfied within the ranges above, the stability of the etching composition may be secured.

In an embodiment, the accelerator may include at least one of Compounds E1 to E18:

E1

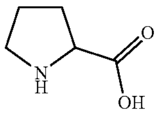

E2

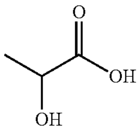

E3

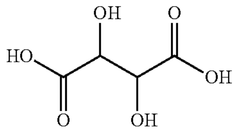

E4

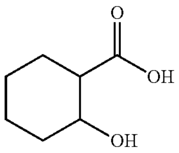

E5

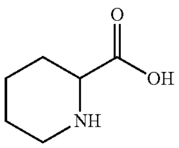

E6

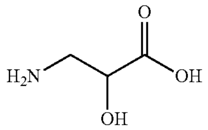

E7

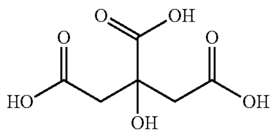 [SMILES: O=C(O)CC(O)(CC(=O)O)C(=O)O]

E8

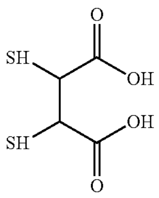

-continued

E9

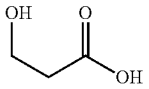

E10

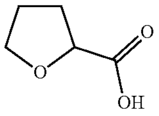

E11

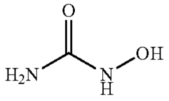

E12

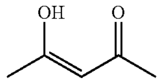

E13

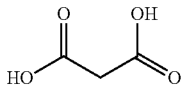

E14

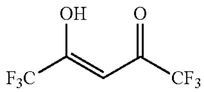

E15

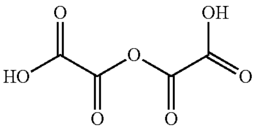 [SMILES: O=C(O)C(=O)OC(=O)C(=O)O]

E16

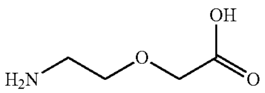

E17

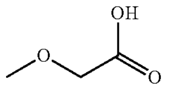

E18

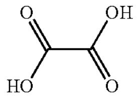

The etching composition including the aforementioned oxidizing agent, ammonium salt, and the like may have a pH in a range of 3.0 to 8.3, 3.0 to 8.0, 3.0 to 7.5, 3.0 to 7.0, 3.0 to 6.5, 3.0 to 6.0, 3.0 to 5.8, 3.0 to 5.6, 3.0 to 5.4, 3.5 to 6.0, 3.5 to 5.8, 3.5 to 5.6, 3.5 to 5.4, 4.0 to 6.0, 4.0 to 5.8, 4.0 to 5.6, or 4.0 to 5.4. When the etching composition has a pH within the ranges above, chelation between the accelerator and the metal may be effectively performed as will be described later.

In an embodiment, the etching composition may be used for etching process and/or CMP process to the metal-containing film. The metal-containing film is defined as described above.

The accelerator in the etching composition may include the compound represented by Formula 1-1, the compound represented by Formula 1-2, the compound represented by Formula 1-3, the compound represented by Formula 1-4, the compound represented by Formula 1-5, the compound represented by Formula 1-6, the compound represented by Formula 1-7, the compound represented by Formula 1-8, or any combination thereof, wherein, i) $X_1$ and $X_2$ in Formulae 1-1 and 1-2 may be linked to each other via a single bond, ii) $T_1$ and $R_2$ in Formula 1-3 may be linked with $Y_1$ and $X_3$ interposed therebetween (that is, $R_2$ is substituted on the α-carbon of an atom which is interposed between $X_3$ and $T_1$ and directly bonded to $X_3$ and $T_1$), iii) $T_{1a}$ and $R_2$ in Formula 1-4 may be linked with a carbon which is directly bonded to $A_1$ and $X_3$ interposed therebetween (that is, $R_2$ is substituted on the α-carbon of the carbon which is directly bonded to $A_1$), iv) $T_1$ and $R_2$ in Formula 1-5 may be linked with $Y_1$, $X_3$ and $X_4$ interposed therebetween (that is, $R_2$ is substituted on the β-carbon of an atom which is interposed between $X_3$ and $T_1$ and directly bonded to $X_3$ and $T_1$), v) $T_{1a}$ and $R_2$ in Formula 1-6 may be linked with a carbon which is directly bonded to $A_1$, $X_3$ and $X_4$ interposed therebetween (that is, $R_2$ is substituted on the β-carbon of the carbon which is directly bonded to $A_1$), vi) $T_1$ and $R_2$ in Formula 1-7 may be linked with $Y_1$, $X_5$ and $X_6$ interposed therebetween (that is, $R_2$ is substituted on the β-carbon of an atom which is interposed between $X_5$ and $T_1$ and directly bonded to $X_5$ and $T_1$), and vii) $T_{1a}$ and $R_2$ in Formula 1-8 may be linked with a carbon which is directly bonded to $A_1$, $X_5$ and $X_6$ interposed therebetween (that is, $R_2$ is substituted on the β-carbon of the carbon which is directly bonded to $A_1$).

In addition, in Formulae 1-1 to 1-8, $X_2$ may be $C(R_2)$, $N(R_2)$, O, S or N(H), $T_1$ may be *—OH, *—SH, or *—$NH_2$, $T_{1a}$ may be O or S, and $R_2$ may be *—$O(Z_5)$, *—$S(Z_5)$, or *—$N(Z_5)(Z_6)$.

In this regard, as shown in <Condition 1> to <Condition 10> as described hereinafter, the accelerator may be linked to metal (M) included in the metal-containing film which is the target etching film, via 0, S, and/or N to form "stable" cyclometalated 5-membered ring or cyclometalated 6-membered ring (see $CY_5$ and $CY_6$ in Formulae 1-1A, 1-1B, 1-2A, 1-2B, 1-3A, 1-4A, 1-5A, 1-6A, 1-7A and 1-8A), thereby significantly improving the etching speed and etching selectivity of the metal-containing film.

Etching Method of Metal-Containing Film and Preparation Method of Semiconductor Device By using the aforementioned etching composition, the metal-containing film may be effectively etched.

FIG. 1 is a flow chart illustrating operations of a method of manufacturing a semiconductor device according to example embodiments.

Referring to FIG. 1, another aspect of example embodiments provides a method of etching a metal-containing film, the method including: preparing a substrate provided with a metal-containing film (S100); and removing at least a portion of the metal-containing film by performing an etching process using the aforementioned etching composition on the metal-containing film (S110).

The metal-containing film is defined as described above.

In one or more embodiments, the metal-containing film may include In, Ti, Al, La, Sc, Ga, Zn, Hf, or any combination thereof.

In one or more embodiments, the metal-containing film may include a metal nitride, a metal oxide, a metal oxynitride, or a combination thereof.

In one or more embodiments, the etching method of metal-containing film may satisfy at least one of <Condition 1> to <Condition 10> during the etching process:

<Condition 1>

The accelerator in the etching composition may include a compound represented by Formula 1-1, wherein, $X_2$ in Formula 1-1 may be $C(R_2)$ or $N(R_2)$, and one of O, S, and N included in $T_1$ of Formula 1-1 and one of O, S, and N included in $R_2$ of Formula 1-1 may be bonded to a metal included in the metal-containing film that is in contact with the etching composition, to form a complex having a structure represented by Formula 1-1A.

<Condition 2>

The accelerator in the etching composition may include a compound represented by Formula 1-1, wherein, $X_2$ in Formula 1-1 may be O, S or N(H), and one of O, S, and N included in $T_1$ of Formula 1-1 and one of O, S, and N included in $X_2$ of Formula 1-1 may be bonded to a metal included in the metal-containing film that is in contact with the etching composition, to form a complex having a structure represented by Formula 1-1B.

<Condition 3>

The accelerator in the etching composition may include a compound represented by Formula 1-2, wherein, $X_2$ in Formula 1-2 may be $C(R_2)$ or $N(R_2)$, and one of O and S included in $T_{1a}$ of Formula 1-2 and one of O, S, and N included in $R_2$ of Formula 1-2 may be bonded to a metal included in the metal-containing film that is in contact with the etching composition, to form a complex having a structure represented by Formula 1-2A.

<Condition 4>

The accelerator in the etching composition may include a compound represented by Formula 1-2, wherein, $X_2$ in Formula 1-2 may be O, S or N(H), and one of O and S included in $T_{1a}$ of Formula 1-2 and one of O, S, and N included in $X_2$ of Formula 1-2 may be bonded to a metal included in the metal-containing film that is in contact with the etching composition, to form a complex having a structure represented by Formula 1-2B.

<Condition 5>

The accelerator in the etching composition may include a compound represented by Formula 1-3, and one of O, S, and N included in $T_1$ of Formula 1-3 and one of O, S, and N included in $R_2$ of Formula 1-3 may be bonded to a metal included in the metal-containing film that is in contact with the etching composition, to form a complex having a structure represented by Formula 1-3A.

<Condition 6>

The accelerator in the etching composition may include a compound represented by Formula 1-4, and one of O and S included in $T_{1a}$ of Formula 1-4 and one of O, S, and N included in $R_2$ of Formula 1-4 may be bonded to a metal included in the metal-containing film that is in contact with the etching composition, to form a complex having a structure represented by Formula 1-4A.

<Condition 7>

The accelerator in the etching composition may include a compound represented by Formula 1-5, and one of O, S, and N included in $T_1$ of Formula 1-5 and one of O, S, and N included in $R_2$ of Formula 1-5 may be bonded to a metal included in the metal-containing film that is in contact with the etching composition, to form a complex having a structure represented by Formula 1-5A.

<Condition 8>

The accelerator in the etching composition may include a compound represented by Formula 1-6, and one of O and S included in Tia of Formula 1-6 and one of O, S, and N included in $R_2$ of Formula 1-6 may be bonded to a metal included in the metal-containing film that is in contact with the etching composition, to form a complex having a structure represented by Formula 1-6A.

<Condition 9>

The accelerator in the etching composition may include a compound represented by Formula 1-7, and one of O, S, and N included in $T_1$ of Formula 1-7 and one of O, S, and N included in $R_2$ of Formula 1-7 may be bonded to a metal included in the metal-containing film that is in contact with the etching composition, to form a complex having a structure represented by Formula 1-7A.

<Condition 10>

The accelerator in the etching composition may include a compound represented by Formula 1-8, and one of O and S included in $T_{1a}$ of Formula 1-8 and one of O, S, and N included in $R_2$ of Formula 1-8 may be bonded to a metal included in the metal-containing film that is in contact with the etching composition, to form a complex having a structure represented by Formula 1-8A:

1-1A

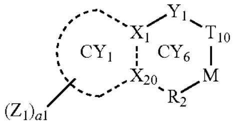

1-1B

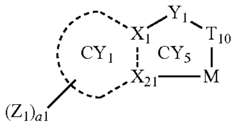

1-2A

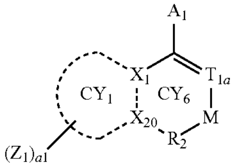

1-2B

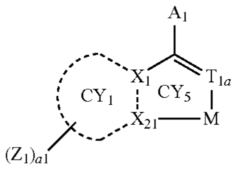

1-3A

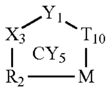

1-4A

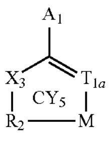

1-5A

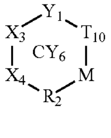

-continued 1-6A

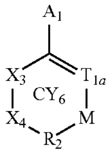

1-7A

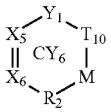

18A

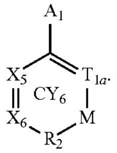

In Formulae 1-1A, 1-1B, 1-2A, 1-2B, 1-3A, 1-4A, 1-5A, 1-6A, 1-7A and 1-8A, $CY_1$, $X_1$, $X_3$ to $X_6$, $Y_1$, $T_{1a}$, $R_2$, $Z_1$, $Z_2$, a1 and $A_1$ are each the same as described herein, M may be a metal included in the metal-containing film that is in contact with the etching composition, $X_{20}$ may be C or N, $X_{21}$ may be O, S, or N, $CY_6$ may a 6-membered ring, and $CY_5$ may be a 5-membered ring.

In one or more embodiments, in Formulae 1-1A, 1-1B, 1-2A, 1-2B, 1-3A, 1-4A, 1-5A, 1-6A, 1-7A and 1-8A, M may be In, Ti, Al, La, Sc, Ga, Zn, Hf, or an ion thereof.

In one or more embodiments, in Formulae 1-1A, 1-1B, 1-2A, 1-2B, 1-3A, 1-4A, 1-5A, 1-6A, 1-7A and 1-8A, $CY_6$ and/or $CY_5$ may have a resonance structure and $Z_5$ and/or $Z_6$ in $R_2$ may be ionized or may be separated from Formulae 1-1A, 1-1B, 1-2A, 1-2B, 1-3A, 1-4A, 1-5A, 1-6A, 1-7A and/or 1-8A.

When the etching method of metal-containing film may satisfy at least one of <Condition 1> to <Condition 10> during the etching process, the etching speed and/or etching selectivity to the metal-containing film may be significantly improved.

By utilizing the etching process for the metal-containing film with the aforementioned etching composition, a semiconductor device having excellent performance may be prepared.

Figure 2:
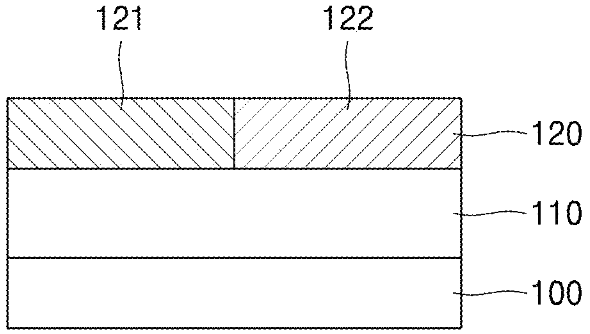
FIGS. 2 and 3 are diagrams for explaining a method of etching a metal-containing film according to example embodiments.
Figure 3:
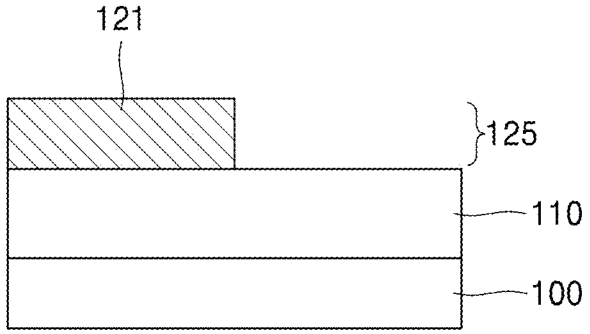

FIGS. 2 and 3 are diagrams for explaining a method of etching a metal-containing film according to example embodiments.

Referring to FIG. 2, a substrate 100 with a metal-containing film 120 may be provided. An interlayer 110 may be between the substrate 100 and the metal-containing film 120. Although not shown, circuitry elements (e.g., transistor gate, metal lines), impurity regions, semiconductor layers may be included in the substrate 100 and/or on the substrate 100 and/or between the substrate 100 and the interlayer 110. In some embodiments, the metal containing film 120 may be formed directly on the substrate 100 and the interlayer 110 layer may be omitted.

The metal-containing film 120 may comprise a first region 121 and a second region 122. A second etching speed that the etching composition etches the second region 122 may be greater than a first etching speed that the etching composition etches the first region 121.

Referring to FIG. 3, the aforementioned etching composition may be used to etch the metal-containing film 120 to remove at least a portion of the metal-containing film 120 (e.g., at least a portion of the second region 122) and form a pattern of the metal-containing film 125. The etching composition may selectively etch the metal-containing film 120 to form the pattern of the metal-containing film 125. The etching process may be performed by contacting the etching composition with at least a portion of the first region 121 and at least a portion of the second region 122.

In one or more embodiments, the first region 121 may substantially have an etching resistance to the etching composition, and at least a portion of the second region 122 in the metal-containing film 120 may be removed by the etching process to form the patter 125.

In one or more embodiments, the first region 121 may include at least one of the metal oxide (e.g., the aluminum oxide) and the silicon oxide.

In one or more embodiments, the second region 122 may include the metal nitride.

In one or more embodiments, the second region 122 may include i) the titanium nitride, ii) the titanium nitride that further includes In, Al, La, Sc, Ga, Zn, Hf, or any combination thereof, or iii) a combination thereof.

Referring to FIG. 1, another aspect of example embodiments provides a method of manufacturing a semiconductor device, the method including: preparing a substrate provided with a metal-containing film (S100); removing at least a portion of the metal-containing film by performing an etching process using the etching composition on the metal-containing film (S110); and performing a subsequent manufacturing process (or processes) to manufacture the semiconductor device (S120).

Examples 1 to 13 and Comparative Examples 1 and 2

Each of etching compositions of Examples 1 to 13 and Comparative Examples 1 and 2 was prepared by mixing materials shown in Table 1 in an amount shown in Table 1. The remnants of each etching composition correspond to water (deionized water).

TABLE 1

| | Oxidizing agent (hydrogen peroxide) | Ammonium salt | | Accelerator | |
|---|---|---|---|---|---|
| | Amount (wt %) | Material | Amount (wt %) | Material | Amount (wt %) |
| Example 1 | 20 | ammonium acetate | 3 | E1 | 0.05 |
| Example 2 | 20 | ammonium acetate | 3 | E2 | 0.05 |
| Example 3 | 20 | ammonium acetate | 3 | E3 | 0.05 |
| Example 4 | 20 | ammonium acetate | 3 | E5 | 0.05 |
| Example 5 | 20 | ammonium acetate | 3 | E7 | 0.05 |
| Example 6 | 20 | ammonium acetate | 3 | E8 | 0.05 |
| Example 7 | 20 | ammonium acetate | 3 | E12 | 0.05 |
| Example 8 | 20 | ammonium acetate | 3 | E13 | 0.05 |
| Example 9 | 20 | ammonium acetate | 3 | E15 | 0.05 |
| Example 10 | 15 | ammonium lactate | 3 | E4 | 0.05 |
| Example 11 | 20 | ammonium lactate | 3 | E10 | 0.03 |
| Example 12 | 20 | ammonium tartrate | 3 | E17 | 0.03 |
| Example 13 | 20 | ammonium acetate | 3 | E18 | 0.05 |
| Comparative Example 1 | 20 | ammonium acetate | 3 | Ref1 | 0.05 |
| Comparative Example 2 | 20 | ammonium acetate | 3 | Ref2 | 0.05 |

TABLE 1-continued

| | Oxidizing agent (hydrogen peroxide) | Ammonium salt | | Accelerator | |
|---|---|---|---|---|---|
| | Amount (wt %) | Material | Amount (wt %) | Material | Amount (wt %) |

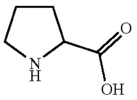

E1

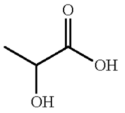

E2

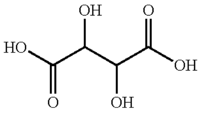

E3

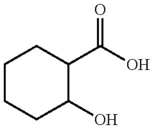

E4

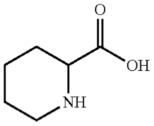

E5

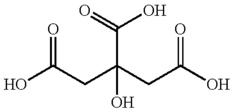

E7

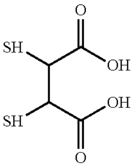

E8

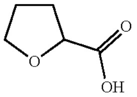

E10

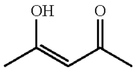

E12

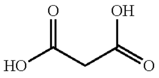

E13

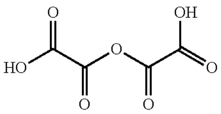

E15

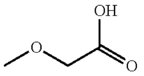

E17

TABLE 1-continued

| | Oxidizing agent (hydrogen peroxide) | Ammonium salt | | Accelerator | |
|---|---|---|---|---|---|
| | Amount (wt %) | Material | Amount (wt %) | Material | Amount (wt %) |
| 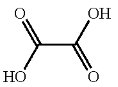 E18 | | | | | |
| 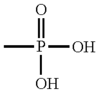 Ref1 | | | | | |
| 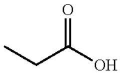 Ref2 | | | | | |

Evaluation Example 1

After the etching composition of Example 1 was added to a beaker and heated up to 70° C., target etching films, i.e., a titanium nitride (TiN) film, a titanium/aluminum nitride (TiAlN) film, and an aluminum oxide ($Al_2O_3$) film that have undergone plasma etching, were each immersed in the etching composition of Example 1 for 5 minutes.

Then, the thickness of each of the target etching films was measured by using an ellipsometer (M-2000, J. A. Woolam) to evaluate the etching speed for each of the target etching films. The results are summarized in Tables 2 and 3.

Subsequently, the presence or absence of residues on the surface of the target etching films after the etching was observed by using XPS equipment, and the results are also summarized in Table 2.

The tests above are repeated by using the etching compositions of Examples 2 to 13 and Comparative Examples 1 and 2, and the results are summarized in Table 2 and/or 3.

TABLE 2

| | Etching speed for film (Å/min) Ti/Al nitride film | Presence/absence of surface residues |
|---|---|---|
| Example 1 | 58 | X |
| Example 2 | 67 | X |
| Example 3 | 158 | X |
| Example 4 | 47 | X |
| Example 5 | 79 | X |
| Example 6 | 63 | X |
| Example 7 | 55 | X |
| Example 8 | 118 | X |
| Example 9 | 74 | X |
| Example 10 | 83 | X |
| Example 11 | 71 | X |
| Example 12 | 60 | X |
| Example 13 | 95 | X |
| Comparative Example 1 | 16 | O |
| Comparative Example 2 | 7 | X |

Presence/absence of surface residues, X: all surface residues on the surface of the target etching film were removed after etching; and
Presence/absence of surface residues, O: surface residues on the surface of the target etching film were hardly removed.

TABLE 3

| | Etching speed of film (Å/min) | |
|---|---|---|
| | Titanium nitride film | Aluminum oxide film |
| Example 1 | 280 | <1 |
| Example 2 | 287 | <1 |
| Example 3 | 423 | <1 |
| Example 4 | 378 | <1 |
| Example 5 | 302 | <1 |
| Example 6 | 311 | <1 |
| Example 7 | 299 | <1 |
| Example 8 | 282 | <1 |
| Example 9 | 332 | <1 |
| Example 10 | 282 | <1 |
| Example 11 | 343 | <1 |
| Example 12 | 321 | <1 |
| Example 13 | 308 | <1 |

Referring to Tables 2 and 3, it was confirmed that the etching compositions of Examples 1 to 13 had excellent etching properties for the titanium/aluminum nitride film as compared with the etching compositions of Comparative Examples 1 and 2, and substantially left no surface residue on the surface of the target etching film. In addition, it was confirmed that the etching compositions of Examples 1 to 13 had appropriate etching properties for the titanium nitride film and the aluminum oxide film.

According to the one or more embodiments, the etching composition has a high etching speed for a target film to be etched and excellent etching selectivity for adjacent layers. In addition, since the etching composition does not substantially leave a surface residue on the surface of the target etching film after etching, an effective etching process for the target etching film may be performed by using the etching composition. Accordingly, a semiconductor device prepared by using the etching process for the metal-containing film with the etching composition may have excellent performance.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An etching composition consisting essentially of:

an oxidizing agent;

an ammonium salt;

an aqueous solvent; and an accelerator, wherein the oxidizing agent includes hydrogen peroxide, and an amount of the oxidizing agent is 15 wt % to 25 wt % based on 100 wt % of the etching composition, the ammonium salt includes an ammonium cation and an organic anion, the accelerator includes a compound represented by Formula 1-1, a compound represented by Formula 1-2, a compound represented by Formula 1-3, a compound represented by Formula 1-4, a compound represented by Formula 1-5, a compound represented by Formula 1-6, a compound represented by Formula 1-7, a compound represented by Formula 1-8, or any combination thereof, 1-1

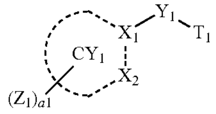

1-2

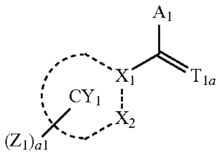

1-3

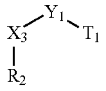

1-4

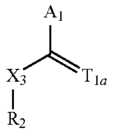

1-5

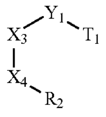

1-6

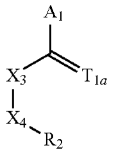

1-7

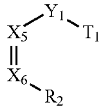

1-8

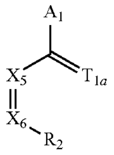

wherein, in Formulae 1-1 to 1-8, $CY_1$ is a $C_3$-$C_8$ saturated cyclic group, $X_1$ is C or N, $X_2$ is $C(R_2)$, $N(R_2)$, O, S or N(H), $X_1$ and $X_2$ are linked to each other via a single bond, $X_3$ is $C(Z_1)(Z_2)$, $N(Z_1)$, C(=O) or C(=S), $X_4$ is $C(Z_{11})(Z_{12})$, $N(Z_{11})$, C(=O) or C(=S), $X_5$ is $C(Z_1)$ or N, $X_6$ is $C(Z_{11})$ or N, $Y_1$ is $C(Z_3)(Z_4)$, $N(Z_3)$, C(=O) or C(=S), $T_1$ is *—OH, *—SH, or *—$NH_2$, $T_{1a}$ is O or S, $R_2$ is *—$O(Z_5)$, *—$S(Z_5)$, or *—$N(Z_5)(Z_6)$, $Z_1$ to $Z_6$, $Z_{11}$, and $Z_{12}$ are each independently, hydrogen, deuterium, *—F, *—Cl, *—Br, *—I, *—OH, *—SH, *—$NH_2$, *—C(=O)H, *—C(=S)H, *—C(=O)—OH, *—C(=S)—OH, *—C(=O)—SH, *—C(=S)—SH, *—C(=O)—$(NH_2)$, *—C(=S)—$(NH_2)$, *—NH—C(=O)—$(NH_2)$, *—NH—C(=S)—$(NH_2)$, *—C(OH)—C(=O)—OH, *—C(SH)—C(=O)—OH, *—C(OH)—C(=S)—OH, *—C(OH)—C(=O)—SH, *—C(SH)—C(=S)—OH, *—C(SH)—C(=O)—SH, *—C(OH)—C(=S)—SH, *—C(SH)—C(=S)—SH, *—C(=O)—C(=O)—OH, *—C(=S)—C(=O)—OH, *—C(=O)—C(=S)—OH, *—C(=O)—C(=O)—SH, *—C(=S)—C(=S)—OH, *—C(=S)—C(=O)—SH, *—C(=O)—C(=S)—SH, *—C(=S)—C(=S)—SH, or *—C(=O)—$ONH_4$; or a $C_1$-$C_{20}$ alkyl group, a $C_2$-$C_{20}$ alkenyl group, a $C_1$-$C_{20}$ alkoxy group, a $C_6$-$C_{20}$ aryl group, or a $C_2$-$C_{20}$ heteroaryl group, unsubstituted or substituted with deuterium, *—F, *—Cl, *—Br, *—I, *—OH, *—SH, *—$NH_2$, *—C(=O)H, *—C(=S)H, *—C(=O)—OH, *—C(=S)—OH, *—C(=O)—SH, *—C(=S)—SH, *—C(=O)—$(NH_2)$, *—C(=S)—$(NH_2)$, *—NH—C(=O)—$(NH_2)$, *—NH—C(=S)—$(NH_2)$, *—C(OH)—C(=O)—OH, *—C(SH)—C(=O)—OH, *—C(OH)—C(=S)—OH, *—C(OH)—C(=O)—SH, *—C(SH)—C(=S)—OH, *—C(SH)—C(=O)—SH, *—C(OH)—C(=S)—SH, *—C(SH)—C(=S)—SH, *—C(=O)—C(=O)—OH, *—C(=S)—C(=O)—OH, *—C(=O)—C(=S)—OH, *—C(=O)—C(=O)—SH, *—C(=S)—C(=S)—OH, *—C(=S)—C(=O)—SH, *—C(=O)—C(=S)—SH, *—C(=S)—C(=S)—SH, *—C(=O)—$ONH_4$, or any combination thereof, a1 is an integer from 0 to 5, $A_1$ is, hydrogen or deuterium; or a $C_1$-$C_{20}$ alkyl group, a $C_2$-$C_{20}$ alkenyl group, a $C_1$-$C_{20}$ alkoxy group, a $C_6$-$C_{20}$ aryl group, or a $C_2$-$C_{20}$ heteroaryl group, unsubstituted or substituted with deuterium, *—F, *—Cl, *—Br, *—I, a $C_1$-$C_{20}$ alkyl group, a $C_1$-$C_{20}$ alkoxy group, or any combination thereof, and

* indicates a binding site to a neighboring atom.

2. The etching composition of claim 1, wherein the etching composition consists of the oxidizing agent, the ammonium salt, the aqueous solvent, and the accelerator.

3. The etching composition of claim 1, wherein $CY_1$ is a 5-membered saturated cyclic group or a 6-membered saturated cyclic group.

4. The etching composition of claim 1, wherein $CY_1$ is a cyclopentane group, a cyclohexane group, a cycloheptane group, a pyrrolidine group, a piperidine group, an azepane group, a tetrahydrofuran group, a tetrahydrothiophene group, a tetrahydro-2H-pyran group, or a tetrahydro-2H-thiopyran group.

5. The etching composition of claim 1, wherein $Z_1$ to $Z_6$, $Z_{11}$, and $Z_{12}$ are each independently, hydrogen, deuterium, *—F, *—Cl, *—Br, *—I, *—OH, *—SH, *—$NH_2$, *—C(=O)H, *—C(=S)H, *—C(=O)—OH, *—C(=S)—OH, *—C(=O)—SH, *—C(=S)—SH, *—C(=O)—$(NH_2)$, *—C(=S)—$(NH_2)$, *—NH—C(=O)—$(NH_2)$, *—NH—C(=S)—$(NH_2)$, *—C(OH)—C(=O)—OH, *—C(SH)—C(=O)—OH, *—C(OH)—C(=S)—OH, *—C(OH)—C(=O)—SH, *—C(SH)—C(=S)—OH, *—C(SH)—C(=O)—SH, *—C(OH)—C(=S)—SH, *—C(SH)—C(=S)—SH, *—C(=O)—C(=O)—OH, *—C(=S)—C(=O)—OH, *—C(=O)—C(=S)—OH, *—C(=O)—C(=O)—SH, *—C(=S)—C(=S)—OH, *—C(=S)—C(=O)—SH, *—C(=O)—C(=S)—SH, *—C(=S)—C(=S)—SH, or *—C(=O)—$ONH_4$; or a $C_1$-$C_{20}$ alkyl group unsubstituted or substituted with deuterium, *—F, *—Cl, *—Br, *—I, *—OH, *—SH, *—$NH_2$, *—C(=O)H, *—C(=S)H, *—C(=O)—OH, *—C(=S)—OH, *—C(=O)—SH, *—C(=S)—SH, *—C(=O)—($NH_2$), *—C(=S)—($NH_2$), *—NH—C(=O)—($NH_2$), *—NH—C(=S)—($NH_2$), *—C(OH)—C(=O)—OH, *—C(SH)—C(=O)—OH, *—C(OH)—C(=S)—OH, *—C(OH)—C(=O)—SH, *—C(SH)—C(=S)—OH, *—C(SH)—C(=O)—SH, *—C(OH)—C(=S)—SH, *—C(SH)—C(=S)—SH, *—C(=O)—C(=O)—OH, *—C(=S)—C(=O)—OH, *—C(=O)—C(=S)—OH, *—C(=O)—C(=O)—SH, *—C(=S)—C(=S)—OH, *—C(=S)—C(=O)—SH, *—C(=O)—C(=S)—SH, *—C(=S)—C(=S)—SH, *—C(=O)—$ONH_4$, or any combination thereof.

6. The etching composition of claim 1, wherein in Formulae 1-3 to 1-8, $X_3$ is $C(Z_1)(Z_2)$, C(=O) or C(=S), $X_4$ is $C(Z_{11})(Z_{12})$, C(=O) or C(=S), $X_5$ is $C(Z_1)$, $X_6$ is $C(Z_{11})$, $Y_1$ is $C(Z_3)(Z_4)$, C(=O) or C(=S), $T_1$ is *—OH or *—SH, $R_2$ is *—$O(Z_5)$ or *—$S(Z_5)$, and $Z_1$ to $Z_6$, $Z_{11}$, and $Z_{12}$ are each independently, hydrogen, deuterium, *—F, *—Cl, *—Br, *—I, *—OH, *—SH, *—C(=O)H, *—C(=S)H, *—C(=O)—OH, *—C(=S)—OH, *—C(=O)—SH, *—C(=S)—SH, *—C(OH)—C(=O)—OH, *—C(SH)—C(=O)—OH, *—C(OH)—C(=S)—OH, *—C(OH)—C(=O)—SH, *—C(SH)—C(=S)—OH, *—C(SH)—C(=O)—SH, *—C(OH)—C(=S)—SH, *—C(SH)—C(=S)—SH, *—C(=O)—C(=O)—OH, *—C(=S)—C(=O)—OH, *—C(=O)—C(=S)—OH, *—C(=O)—C(=O)—SH, *—C(=S)—C(=S)—OH, *—C(=S)—C(=O)—SH, *—C(=O)—C(=S)—SH, or *—C(=S)—C(=S)—SH; or a $C_1$-$C_{20}$ alkyl group, a $C_2$-$C_{20}$ alkenyl group, a $C_1$-$C_{20}$ alkoxy group, a $C_6$-$C_{20}$ aryl group, or a $C_2$-$C_{20}$ heteroaryl group, unsubstituted or substituted with deuterium, *—F, *—Cl, *—Br, *—I, *—OH, *—SH, *—C(=O)H, *—C(=S)H, *—C(=O)—OH, *—C(=S)—OH, *—C(=O)—SH, *—C(=S)—SH, *—C(OH)—C(=O)—OH, *—C(SH)—C(=O)—OH, *—C(OH)—C(=S)—OH, *—C(OH)—C(=O)—SH, *—C(SH)—C(=S)—OH, *—C(SH)—C(=O)—SH, *—C(OH)—C(=S)—SH, *—C(SH)—C(=S)—SH, *—C(=O)—C(=O)—OH, *—C(=S)—C(=O)—OH, *—C(=O)—C(=S)—OH, *—C(=O)—C(=O)—SH, *—C(=S)—C(=S)—OH, *—C(=S)—C(=O)—SH, *—C(=O)—C(=S)—SH, *—C(=S)—C(=S)—SH, or any combination thereof.

7. The etching composition of claim 1, wherein, the accelerator includes a compound represented by Formula 1-1, a compound represented by Formula 1-2, or any combination thereof.

8. The etching composition of claim 1, wherein, the accelerator includes a compound represented by Formula 1-3, a compound represented by Formula 1-4, a compound represented by Formula 1-5, a compound represented by Formula 1-6, a compound represented by Formula 1-7, a compound represented by Formula 1-8, or any combination thereof.

9. The etching composition of claim 1, wherein the accelerator comprises at least one of Compounds E1 to E18:

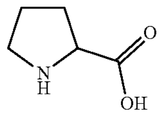
E1

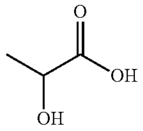
E2

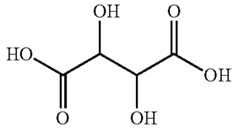
E3

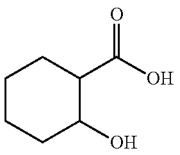
E4

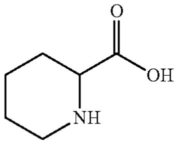
E5

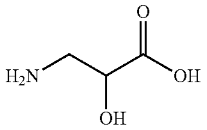
E6

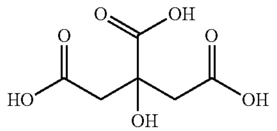
E7

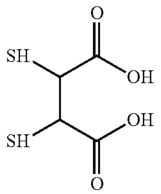
E8

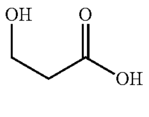
E9

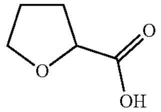
E10

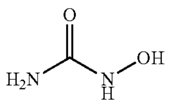
E11

-continued

E12

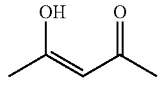

E13

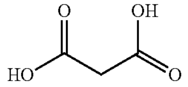

E14

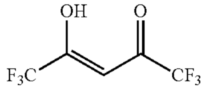

E15

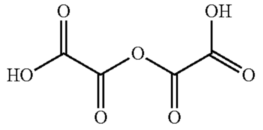

E16

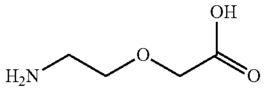

E17

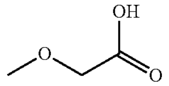

E18

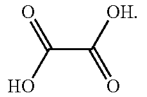

10. The etching composition of claim 1, wherein an amount of the ammonium salt is in a range of about 0.5 wt % to about 20 wt % based on 100 wt % of the etching composition.

11. The etching composition of claim 1, wherein an amount of the accelerator is in a range of about 0.001 wt % to about 20 wt % based on 100 wt % of the etching composition.

12. The etching composition of claim 1, wherein the etching composition has a pH in a range of about 3.0 to about 8.3.

13. A method of etching a metal-containing film, the method comprising:

preparing a substrate provided with the metal-containing film; and removing at least a portion of the metal-containing film by performing an etching process using the etching composition of claim 1 to the metal-containing film.

14. The method of claim 13, wherein the metal-containing film comprises indium (In), titanium (Ti), aluminum (Al), lanthanum (La), scandium (Sc), gallium (Ga), zinc (Zn), hafnium (Hf), or any combination thereof.

15. The method of claim 13, wherein the metal-containing film comprises a metal nitride, a metal oxide, a metal oxynitride, or a combination thereof.

16. The method of claim 15, wherein the metal-containing film comprises a first region and a second region, a second etching speed that the etching composition etches the second region is greater than a first etching speed that the etching composition etches the first region, and the etching process is performed by contacting the etching composition with at least a portion of the first region and at least a portion of the second region.

17. The method of claim 16, wherein the first region substantially has an etching resistance to the etching composition and comprises the metal oxide, a silicon oxide, or any combination thereof, and at least a portion of the second region in the metal-containing film is removed by the etching process and comprises the metal nitride, the metal oxynitride, or a combination thereof.

18. The method of claim 16, wherein the second region comprises i) a titanium nitride, ii) a titanium nitride that further includes In, Al, La, Sc, Ga, Zn, Hf, or any combination thereof, or iii) a combination thereof.

19. A method of manufacturing a semiconductor device, the method comprising:

preparing a substrate provided with a metal-containing film; and removing at least a portion of the metal-containing film by performing an etching process using the etching composition of claim 1 to the metal-containing film.

20. An etching composition comprising:

an oxidizing agent;

an ammonium salt;

an aqueous solvent; and an accelerator, wherein the oxidizing agent includes hydrogen peroxide, and an amount of the oxidizing agent is 15 wt % to 25 wt % based on 100 wt % of the etching composition, the ammonium salt includes an ammonium cation and an organic anion, the etching composition does not include a fluorine-containing compound, and the accelerator includes a compound represented by Formula 1-1, a compound represented by Formula 1-2, a compound represented by Formula 1-3, a compound represented by Formula 1-4, a compound represented by Formula 1-5, a compound represented by Formula 1-6, a compound represented by Formula 1-7, a compound represented by Formula 1-8, or any combination thereof, 1-1

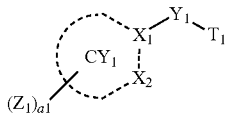

1-2

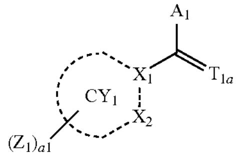

1-3

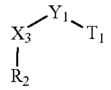

1-4

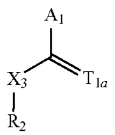

-continued 1-5

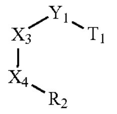

1-6

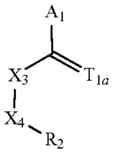

1-7

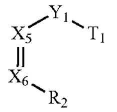

1-8

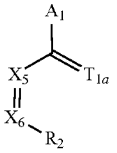

wherein, in Formulae 1-1 to 1-8, $CY_1$ is a $C_3$-$C_8$ saturated cyclic group, $X_1$ is C or N, $X_2$ is $C(R_2)$, $N(R_2)$, O, S or N(H), $X_1$ and $X_2$ are linked to each other via a single bond, $X_3$ is $C(Z)(Z_2)$, $N(Z_1)$, C(═O) or C(═S), $X_4$ is $C(Z_{11})(Z_{12})$, $N(Z_{11})$, C(═O) or C(═S), $X_5$ is $C(Z_1)$ or N, $X_6$ is $C(Z_{11})$ or N, $Y_1$ is $C(Z_3)(Z_4)$, $N(Z_3)$, C(═O) or C(═S), $T_1$ is *—OH, *—SH, or *—$NH_2$, $T_{1a}$ is O or S, $R_2$ is *—$O(Z_5)$, *—$S(Z_5)$, or *—$N(Z_5)(Z_6)$, $Z_1$ to $Z_6$, $Z_{11}$, and $Z_{12}$ are each independently, hydrogen, deuterium, *—Cl, *—Br, *—I, *—OH, *—SH, *—$NH_2$, *—C(═O)H, *—C(═S)H, *—C(═O)—OH, *—C(═S)—OH, *—C(═O)—SH, *—C(═S)—SH, *—C(═O)—($NH_2$), *—C(═S)—($NH_2$), *—NH—C(═O)—($NH_2$), *—NH—C(═S)—($NH_2$), *—C(OH)—C(═O)—OH, *—C(SH)—C(═O)—OH, *—C(OH)—C(═S)—OH, *—C(OH)—C(═O)—SH, *—C(SH)—C(═S)—OH, *—C(SH)—C(═O)—SH, *—C(OH)—C(═S)—SH, *—C(SH)—C(═S)—SH, *—C(═O)—C(═O)—OH, *—C(═S)—C(═O)—OH, *—C(═O)—C(═S)—OH, *—C(═O)—C(═O)—SH, *—C(═S)—C(═S)—OH, *—C(═S)—C(═O)—SH, *—C(═O)—C(═S)—SH, *—C(═S)—C(═S)—SH, or *—C(═O)—$ONH_4$; or a $C_1$-$C_{20}$ alkyl group, a $C_2$-$C_{20}$ alkenyl group, a $C_1$-$C_{20}$ alkoxy group, a $C_6$-$C_{20}$ aryl group, or a $C_2$-$C_{20}$ heteroaryl group, unsubstituted or substituted with deuterium, *—Cl, *—Br, *—I, *—OH, *—SH, *—$NH_2$, *—C(═O)H, *—C(═S)H, *—C(═O)—OH, *—C(═S)—OH, *—C(═O)—SH, *—C(═S)—SH, *—C(═O)—($NH_2$), *—C(═S)—($NH_2$), *—NH—C(═O)—($NH_2$), *—NH—C(═S)—($NH_2$), *—C(OH)—C(═O)—OH, *—C(SH)—C(═O)—OH, *—C(OH)—C(═S)—OH, *—C(OH)—C(═O)—SH, *—C(SH)—C(═S)—OH, *—C(SH)—C(═O)—SH, *—C(OH)—C(═S)—SH, *—C(SH)—C(═S)—SH, *—C(═O)—C(═O)—OH, *—C(═S)—C(═O)—OH, *—C(═O)—C(═S)—OH, *—C(═O)—C(═O)—SH, *—C(═S)—C(═S)—OH, *—C(═S)—C(═O)—SH, *—C(═O)—C(═S)—SH, *—C(═S)—C(═S)—SH, *—C(═O)—$ONH_4$, or any combination thereof, a1 is an integer from 0 to 5, $A_1$ is, hydrogen or deuterium; or a $C_1$-$C_{20}$ alkyl group, a $C_2$-$C_{20}$ alkenyl group, a $C_1$-$C_{20}$ alkoxy group, a $C_6$-$C_{20}$ aryl group, or a $C_2$-$C_{20}$ heteroaryl group, unsubstituted or substituted with deuterium, *—Cl, *—Br, *—I, a $C_1$-$C_{20}$ alkyl group, a $C_1$-$C_{20}$ alkoxy group, or any combination thereof, and

* indicates a binding site to a neighboring atom.

* * * * *